US009071231B2

(12) United States Patent
Ma (10) Patent No.: US 9,071,231 B2
(45) Date of Patent: Jun. 30, 2015

(54) APPARATUSES AND METHODS FOR DUTY CYCLE ADJUSTMENTS (71) Applicant: Micron Technology, Inc., Boise, ID (US)

(72) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/094,208

(22) Filed: Dec. 2, 2013

(65) Prior Publication Data

US 2015/0155855 A1 Jun. 4, 2015

(51) Int. Cl.
*H03K 3/017* (2006.01)
(52) U.S. Cl.
CPC ........................................ *H03K 3/017* (2013.01)
(58) Field of Classification Search
USPC ........................................................ 327/175
See application file for complete search history.

(56) References Cited

U.S. PATENT DOCUMENTS

2009/0295446 A1* 12/2009 Yun et al. ...................... 327/175

* cited by examiner

*Primary Examiner* — Daniel Puentes
(74) *Attorney, Agent, or Firm* — Schwegman Lundberg & Woessner, P.A.

(57) ABSTRACT

Apparatuses and methods have been disclosed. One such apparatus includes a plurality of gates coupled together in series. A first pull-down circuit can be coupled to a node between two adjacent gates of the plurality of gates and controlled responsive to a first control signal. A second pull-down circuit can be coupled to an output of one of the gates and controlled responsive to a second control signal. A duty cycle of a signal provided by the plurality of gates can be increased responsive to the first control signal and can be decreased responsive to the second control signal. The plurality of gates and the first and second pull-down circuits can make up a duty cycle adjuster circuit that can adjust the duty cycle of the signal by adjusting only a single type of edges of the signal.

18 Claims, 8 Drawing Sheets

APPARATUSES AND METHODS FOR DUTY CYCLE ADJUSTMENTS

BACKGROUND

Apparatuses such as electronic devices can have a clock circuit that can generate a clock signal to synchronize at least certain circuits within the electronic device. Certain electronic devices (e.g., memory devices) that employ these clock circuits can be manufactured to meet certain timing standards. Thus, a memory device that includes a clock circuit can generate a clock signal to meet a particular timing standard in order to be compatible with other electronic devices that interact with the memory device.

A signal might be generated with relatively small timing inaccuracies and/or a clock path of a circuit can introduce timing inaccuracies into the signal. These timing inaccuracies can be corrected by a duty cycle adjuster circuit (e.g., a duty cycle correction circuit) that can adjust the duty cycle of a clock signal. However, a problem with conventional duty cycle adjuster circuits is that they adjust falling edges of the clock signal to increase duty cycle, but then have to adjust rising edges of the clock signal to decrease the duty cycle. Also, when the rising edges of the clock signal are adjusted, it can impact timing and jitter performance by introducing accuracy mismatches and increasing power and lock time budgets.

Figure 1A:
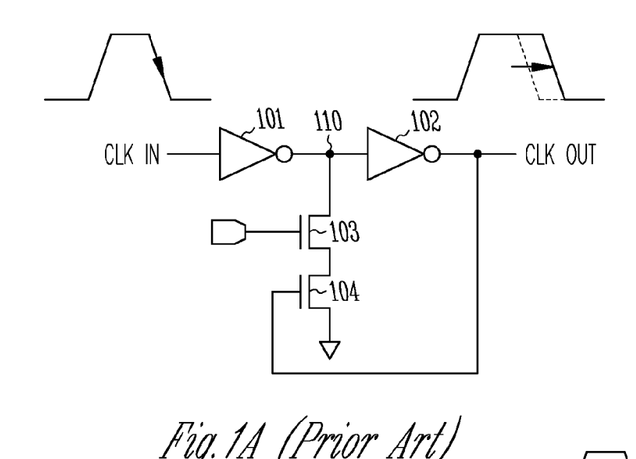
FIGS. 1A and 1B illustrate schematic diagrams of typical prior art duty cycle correction circuits.
Figure 1B:
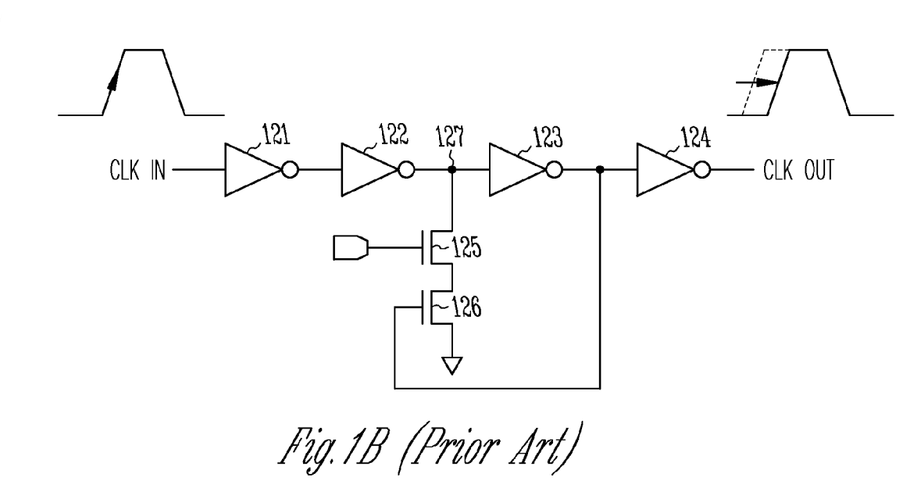

FIGS. 1A and 1B illustrate typical prior art duty cycle adjuster circuits. FIG. 1A shows a schematic diagram of a circuit that can increase the duty cycle of a clock signal as shown by adjusting (e.g., skewing) the falling edges of the clock signal. A low signal on a first inverter 101 is inverted to a high signal that is inverted back to a low signal at the output of the circuit by a second inverter 102. However, the CLK OUT low signal is delayed by the gate delays resulting from the two inverters 101, 102. Thus, the resulting high signal at the node 110 between the inverters 101, 102 during that delay can enable the n-channel metal-oxide semiconductor (NMOS) transistors 103, 104 when their control gates are properly biased. A control signal on the first transistor 103 can then enable that transistor 103 and the resulting delayed high signal from the CLK OUT can enable the second transistor 104 such that the node between the two inverters is pulled down. This resulting low signal is inverted to a high signal at CLK OUT, thus adjusting the falling edges of the output clock CLK OUT.

FIG. 1B shows a circuit that can decrease the duty cycle of a clock signal as shown by adjusting the rising edges of the clock signal. The first two inverters 121, 122 provide (e.g., produce, generate, output, etc.) a substantially similar signal at the middle node 127 as the input clock CLK IN except delayed by two gate delays from the inverters 121, 122. A third inverter 123 provides an inverted clock signal that is delayed by yet another gate delay caused by the third inverter 123. These delays provide a high signal at the middle node 127 at substantially the same time that the control gates of NMOS transistors 125, 126 are biased with enable voltages from a control signal and the delayed signal from the third inverter 123. When these transistors 125, 126 turn on, they pull down the middle node 127 when normally that node would be going high, thus adjusting the rising edges of the output clock CLK OUT. However, such an adjustment of the duty cycle using the rising edges can introduce timing problems with certain standards and jitter performance problems.

There are general needs to adjust a signal duty cycle to deal with timing and jitter performance problems.

DETAILED DESCRIPTION

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure.

The following embodiments include duty cycle adjuster circuits that can adjust the duty cycle of an output signal by adjusting only a single type of edges (e.g., just the falling edges or just the rising edges) of the output signal. For example, whether the duty cycle is to be increased or decreased, only a single type of edges (e.g., either the falling edges or the rising edges, but not both) of the signal is adjusted or vice versa.

Figure 2:
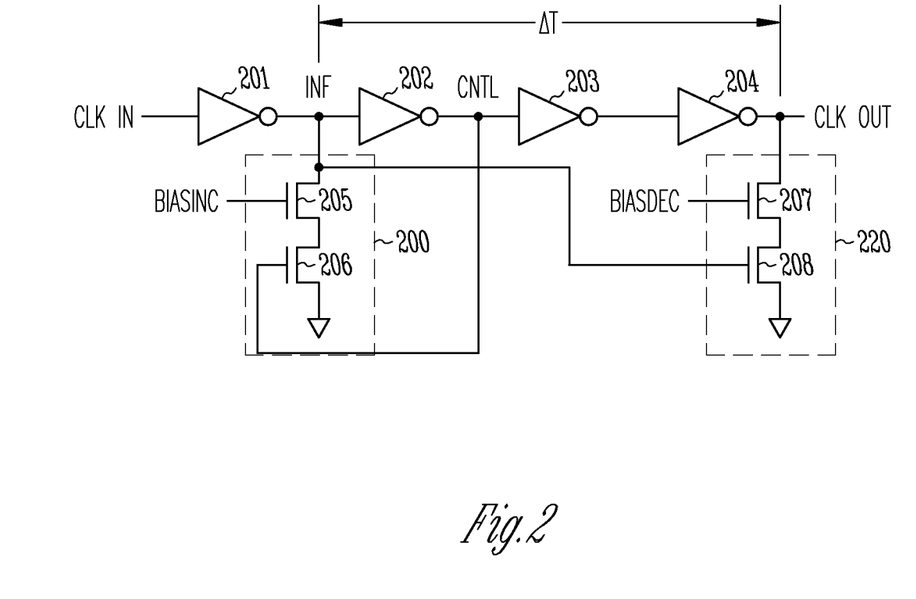
FIG. 2 illustrates a schematic diagram of an embodiment of a duty cycle adjuster circuit.

FIG. 2 illustrates a schematic diagram of an embodiment of a duty cycle adjuster circuit. This circuit includes a plurality of series coupled gates 201-204 (e.g., inverters). At an INF node, a first pair of transistors 200 (e.g., NMOS) are coupled together in series between the INF node and a reference voltage node (e.g., circuit ground). The collector of a first transistor 205 of the first pair of transistors 200 is coupled to the INF node, the collector of a second transistor 206 is coupled to the drain of the first transistor 205, and the drain of the second transistor 206 is coupled to the reference voltage node. In another embodiment, the first transistor 205 and the second transistor 206 can swap locations.

At the output CLK OUT, a second pair of transistors 220 (e.g., NMOS) are coupled together in series between the CLK OUT output and the reference voltage node. The collector of a first transistor 207 of the second pair of transistors 220 is coupled to the CLK OUT output, the collector of a second transistor 208 is coupled to the drain of the first transistor 207, and the drain of the second transistor 208 is coupled to the reference voltage node. The first and second pairs of transistors 200, 220 can act as pull-down circuits.

The circuit can receive an input signal CLK IN, provide an output signal CLK OUT, and be responsive to a bias increase control signal BIASINC and a bias decrease control signal BIASDEC. The BIASINC signal is coupled to a control gate of and enables/disables the first transistor 205 of the first pair of transistors 200. The BIASDEC signal is coupled to a control gate of and enables/disables the first transistor 207 of the second pair of transistors 220.

Figure 5:
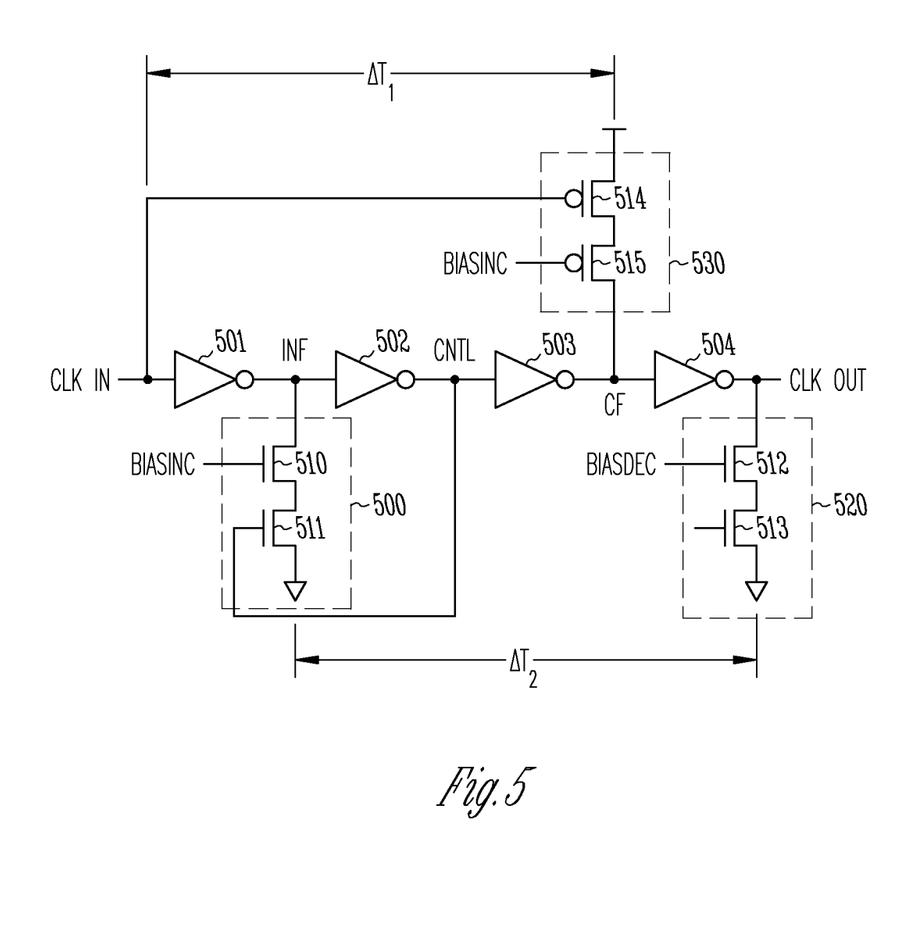
FIG. 5 illustrates a schematic diagram of another embodiment of a duty cycle adjuster circuit.
Figure 8:
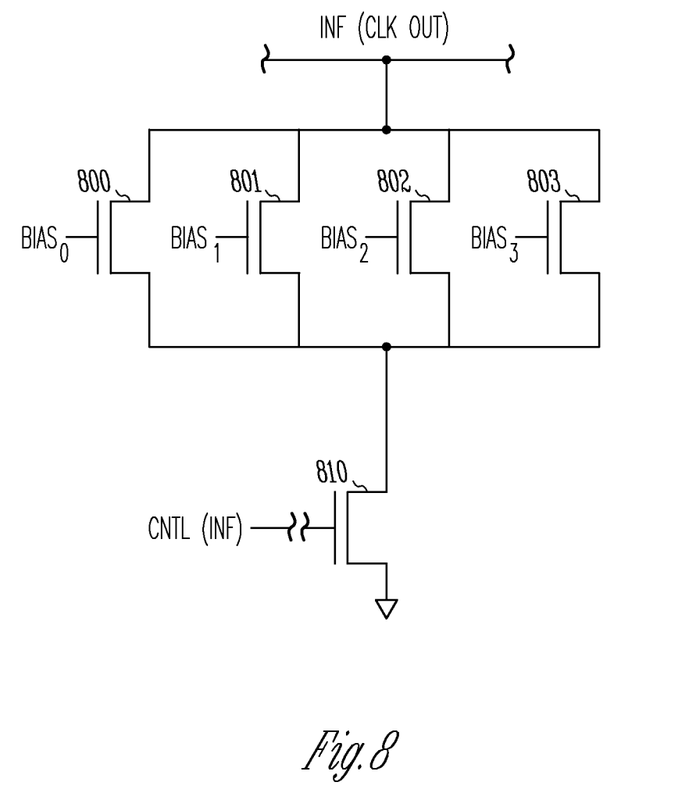
FIG. 8 illustrates another embodiment in accordance with the embodiments of FIGS. 2 and 4.

The BIASINC and BIASDEC control signals are shown in the embodiments of FIGS. 2 and 5 as being analog voltage signals coupled to the control gates of their respective transistors. However, another embodiment can incorporate digital, multiple bit bias increase and decrease control signals as shown in FIG. 8 and described subsequently.

In the embodiment of FIG. 2, the BIASINC and BIASDEC signals are both active high. A high signal level can be any voltage that is at least at the threshold voltage of the respective transistor in order to enable the transistor such that it conducts. A low signal level can be any voltage that is less than the threshold voltage of the respective transistors such that the transistor is disabled and does not conduct. Thus, when it is desired to increase the duty cycle of the output signal, the BIASINC signal can be increased to a high level while the BIASDEC signal is at a low level. When it is desired to decrease the duty cycle, the BIASINC signal can be at a low level while the BIASDEC signal can be increased to a high level. Other embodiments can use both active low BIASINC and BIASDEC signals or a combination of active high and active low signals.

The control gate of the second transistor 206 of the first pair of transistors 200 is coupled to a CNTL node between two of the inverters 202, 203. The control gate of the second transistor 208 of the second pair of transistors 220 is coupled to the INF node.

Figure 3:
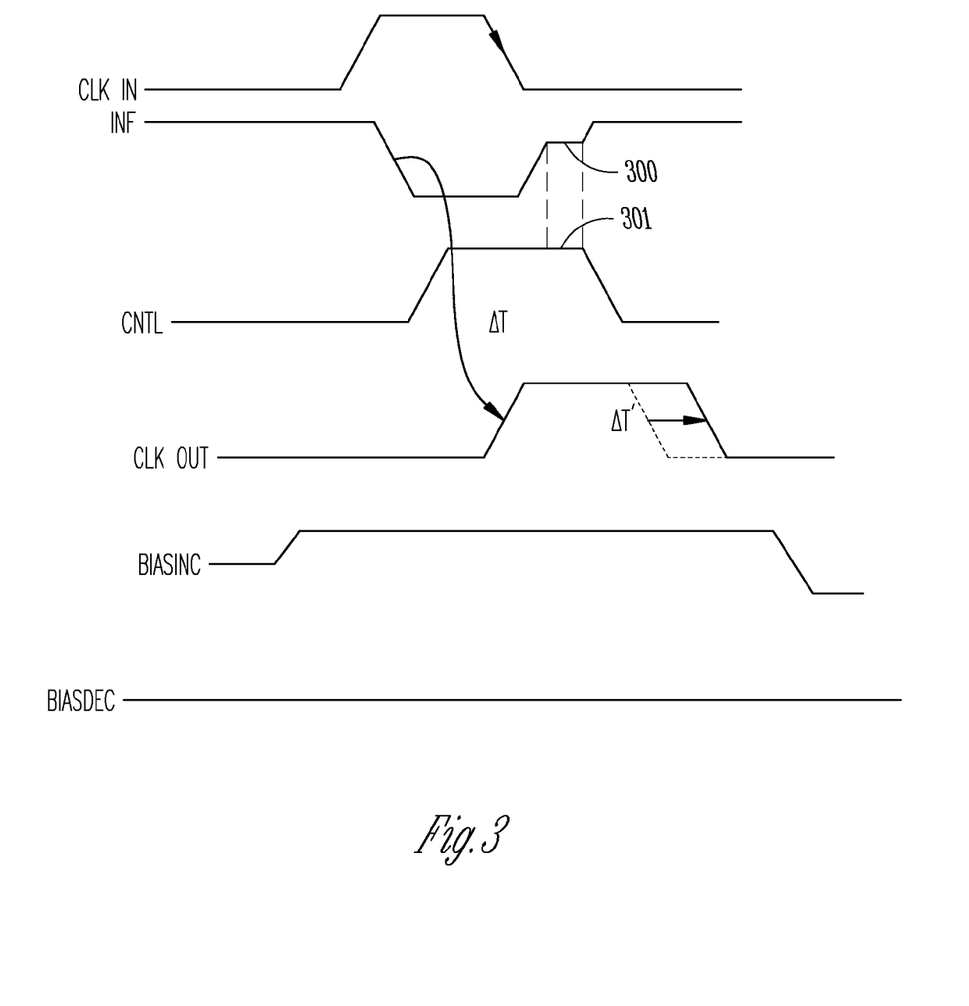
FIG. 3 illustrates an embodiment of a timing diagram for a duty cycle increase operation in accordance with the embodiment of FIG. 2.

FIG. 3 illustrates an embodiment of a timing diagram for a duty cycle increase operation of the circuit of FIG. 2. The timing diagram shows only a single pulse for purposes of clarity. However, one skilled in the art would realize that the circuit of FIG. 2 would work the same with a signal comprising a plurality of pulses.

Referring to both FIG. 2 and FIG. 3, the CLK IN pulse is shown going from a low level to a high level into the first gate 201. The output of the first gate 201 is the INF node that is shown going to a low level. The low-going INF signal is delayed from the CLK IN signal by one gate delay.

The INF signal is input to the second gate 202 that can then invert it and generate the CNTL signal at the CNTL node. This signal is delayed from the CLK IN signal by two gate delays and is used to control the second transistor 206. When the CNTL signal reaches a threshold voltage for the second transistor 206, the second transistor 206 can turn on and conduct when both the first transistor 205 is turned on and when the INF signal reaches a collector voltage high enough above the reference. Thus, when the BIASINC signal is high, the INF signal is high, and the CNTL signal is high, the INF node can be pulled down. FIG. 3 shows the time 301 on the CNTL signal where, due to the gate delays, the CNTL signal and the INF signal would be high substantially simultaneously. The time 300 where the INF signal is pulled low is shown matching up with the time 301 of the CNTL signal.

The delay of the rising edge of the INF signal going high at area 300 can cause the CLK OUT signal to be delayed as well. This has the effect of moving the falling edge of CLK OUT by a particular time represented by $\Delta T'$. The delay of the rising edge of the INF signal can be controlled by the BIASINC signal.

As shown in FIG. 2, $\Delta T'$ can be determined by the quantity of gates (e.g., gate delay) between the INF node and the output of the circuit. Thus, in order to change the amount $\Delta T'$ by which the CLK OUT signal can be adjusted, the quantity of gates between the INF node and the output of the circuit can be changed. Increasing the quantity of gates can increase $\Delta T'$ and decreasing the quantity of gates can decrease $\Delta T'$.

During the duty cycle increase operation, the second pair of transistors 220 are turned off since BIASDEC is at a low level. Thus, this circuit 220 has no affect on the CLK OUT signal at this time.

The above described embodiment assumes a digital implementation of the embodiment of FIG. 2. In other words, when the BIASINC signal is a logical high state (e.g., at threshold voltage of transistor 205), the transistor 205 is turned on. However, FIG. 2 can also operate in an analog implementation. In such an embodiment, the voltage level of the BIASINC signal above the threshold voltage of transistor 205 can determine the amount of adjustment of the duty cycle. Thus, increasing the voltage level of the BIASINC signal will increase $\Delta T'$. For example, if the threshold level of transistor 205 is 0.5V, any voltage level for BIASINC that is above 0.5V will increase $\Delta T'$.

Additionally, the strength of the pull down of the first pair of transistors 200 can affect the duty cycle change. The inverter 201 includes an internal pull up resistor (not shown). The ratio of the pull down, effected by the first pair of transistors 200, to the pull up of the internal pull up resistor of inverter 201 can adjust the duty cycle. For example, increasing the BIASINC voltage level can increase the pull down strength and, thus, increase $\Delta T'$.

Figure 4:
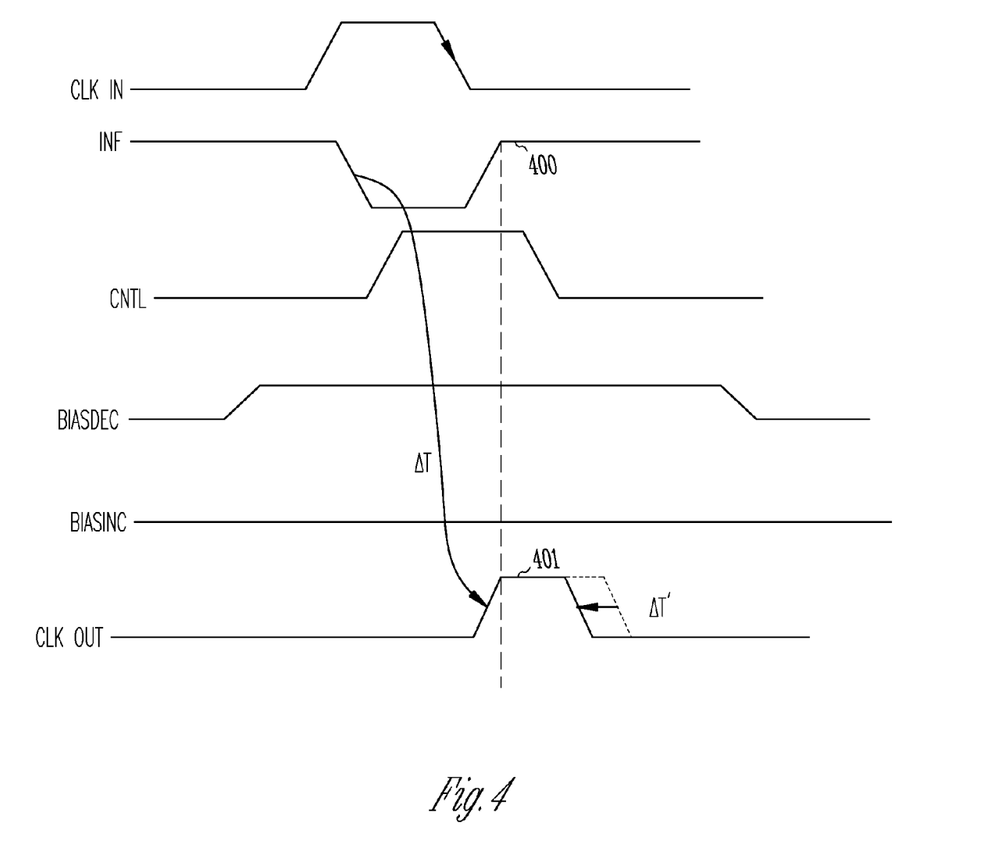
FIG. 4 illustrates an embodiment of a timing diagram for a duty cycle decrease operation in accordance with the embodiment of FIG. 2.

FIG. 4 illustrates a timing diagram of an embodiment of a duty cycle decrease operation of the circuit of FIG. 2. The timing diagram shows only a single pulse for purposes of clarity. However, one skilled in the art would realize that the circuit of FIG. 2 would work the same with a signal comprising a plurality of pulses.

Referring to both FIG. 2 and FIG. 4, the CLK IN pulse is shown going from a low level to a high level into the first gate 201. The output of the first gate 201 is the INF node that is shown going to a low level. The low-going INF signal is delayed from the CLK IN signal by one gate delay. $\Delta T$ is the maximum duty cycle increase amount. The duty cycle increase is controlled by the strength ratio of pull down 220

The INF signal is input to the second gate 202 that can then invert it and generate the CNTL signal at the CNTL node. The INF signal can also be used to control the second transistor 208 of the second pair of transistors 220. When the INF signal reaches a threshold voltage for the second transistor 208, the second transistor 208 can turn on and conduct when both the first transistor 207 of the pair of transistors 220 is turned on and when the CLK OUT signal reaches a collector voltage high enough above the reference. Thus, when the BIASDEC signal is high, the INF signal is high, and the CLK OUT signal is high, the CLK OUT output node can be pulled down by the second pair of transistors 220 at a time $\Delta T$ prior to when the CLK OUT signal would normally go low. FIG. 4 shows the point 401 on the CLK OUT signal where, due to the gate delays, the CLK OUT signal and the INF signal would be high substantially simultaneously.

As in the duty cycle increase embodiment above, the time period $\Delta T'$ that the duty cycle can be decreased can be determined by the quantity of gates (e.g., gate delay) between the INF node and the output of the circuit. Thus, in order to change the amount $\Delta T'$ by which the CLK OUT signal can be adjusted, the quantity of gates between the INF node and the output of the circuit can be changed. Increasing the quantity of gates can increase $\Delta T'$ and decreasing the quantity of gates can decrease $\Delta T'$.

During the duty cycle decrease operation, the first pair of transistors 200 are turned off since BIASINC is at a low level. Thus, this circuit 200 has no affect on the CLK OUT signal at this time.

The above described embodiment in FIG. 4 assumes a digital implementation of the embodiment of FIG. 2. In other words, when the BIASDEC signal is a logical high state (e.g., at threshold voltage of transistor 207), the transistor 207 is turned on. However, FIG. 2 can also operate in an analog implementation. In such an embodiment, the voltage level of the BIASDEC signal above the threshold voltage of transistor 207 can determine the amount of adjustment of the duty cycle. Thus, increasing the voltage level of the BIASDEC signal will decrease $\Delta T'$. For example, if the threshold level of transistor 207 is 0.5V, any voltage level for BIASDEC that is above 0.5V will decrease $\Delta T'$.

Additionally, the strength of the pull down of the second pair of transistors 220 can affect the duty cycle change. The inverter 204 includes an internal pull up resistor (not shown). The ratio of the pull down, effected by the second pair of transistors 220, to the pull up of the internal pull up resistor of inverter 204 can adjust the duty cycle. For example, increasing the BIASDEC voltage level can increase the pull down strength and, thus, decrease $\Delta T'$.

FIG. 5 illustrates another embodiment of a duty cycle adjuster circuit. This embodiment enables a range of time for the duty cycle adjustment. This range can be illustrated in FIG. 5 as a time period between $\Delta T_1$ and $\Delta T_2$. The $\Delta T_1$ and $\Delta T_2$ times can be the same or different. As seen in the circuit of FIG. 5, $\Delta T_1$ can be adjusted by the quantity of gates (e.g., gate delay) between the input node CLK IN and a CF node. Similarly, $\Delta T_2$ can be adjusted by the quantity of gates between the output node CLK OUT and an INF node. $\Delta T_1 + \Delta T_2$ indicates a maximum range of duty cycle change amount.

The circuit of FIG. 5 comprises a plurality of gates 501-504 (e.g., inverters) coupled in series. At an INF node, a first pair of transistors 500 (e.g., NMOS) are coupled together in series between the INF node and a reference voltage node (e.g., circuit ground). The collector of a first transistor 510 of the first pair of transistors 500 is coupled to the INF node, the collector of a second transistor 511 is coupled to the drain of the first transistor 510, and the drain of the second transistor 511 is coupled to the reference voltage.

At the output CLK OUT, a second pair of transistors 520 (e.g., NMOS) are coupled together in series between the CLK OUT output and the reference voltage node. The collector of a first transistor 512 of the second pair of transistors 520 is coupled to the CLK OUT output, the collector of a second transistor 513 is coupled to the drain of the first transistor 512, and the drain of the second transistor 513 is coupled to the reference voltage node.

At a CF node, a third pair of transistors 530 (e.g., PMOS) are coupled between the CF node and a voltage source node (e.g., supply voltage node). The collector of a first transistor 514 of the third pair of transistors 530 is coupled to the voltage source node, the collector of a second transistor 515 is coupled to the drain of the first transistor 514, and the drain of the second transistor 515 is coupled to the CF node. The first and second pairs of transistors 500, 520 can act as pull-down circuits while the third pair of transistors 530 can act as a pull-up circuit.

The circuit can receive an input signal CLK IN, provide an output signal CLK OUT, and be responsive to a bias increase control signal BIASINC, and a bias decrease control signal BIASDEC. The BIASINC signal is coupled to a control gate of and enables/disables the first transistor 510 of the first pair of transistors 500 and the first transistor of the third pair of transistors 530. The BIASDEC signal is coupled to a control gate of and enables/disables the first transistor 512 of the second pair of transistors 520.

In a digital implementation of the embodiment of FIG. 5, the BIASINC and BIASDEC signals are both active high. A high signal level can be any voltage that is at least at the threshold voltage of the respective transistor in order to enable the transistor such that it conducts. A low signal level can be any voltage that is less than the threshold voltage of the respective transistors such that the transistor is disabled and does not conduct. Thus, when it is desired to increase the duty cycle of the output signal, the BIASINC signal can be increased to a high level while the BIASDEC signal is at a low level. When it is desired to decrease the duty cycle, the BIASINC signal can be at a low level while the BIASDEC signal can be increased to a high level. Other embodiments can use active low BIASINC and BIASDEC signals or a combination of active high and active low signals.

The control gate of the second transistor 511 of the first pair of transistors 500 is coupled to a CNTL node between two of the gates 502, 503. The control gate of the second transistor 513 of the second pair of transistors 520 is coupled to the INF node. The control gate of the second transistor 514 of the third pair of transistors 530 is coupled to the input CLK IN. Using the types of transistors illustrated in FIG. 5, each of the second transistors 511, 513 of the first and second pairs of transistors 500, 520 can be enabled by a high signal while the second transistor 514 of the third pair of transistors 530 can be enabled by a low signal.

In an analog implementation of the embodiment of FIG. 5, the voltage level of the BIASINC signal above the threshold voltage of transistor 510 can determine the amount of adjustment of the duty cycle. Thus, increasing the voltage level of the BIASINC signal will increase $\Delta T'$. For example, if the threshold level of transistor 510 is 0.5V, any voltage level for BIASINC that is above 0.5V will increase $\Delta T'$.

Additionally, the strength of the pull down of the first pair of transistors 500 can affect the duty cycle change. The inverter 501 includes an internal pull up resistor (not shown). The ratio of the pull down, effected by the first pair of transistors 500, to the pull up of the internal pull up resistor can adjust the duty cycle. For example, increasing the BIASINC voltage level above the transistor 510 threshold level can increase the pull down strength and, thus, increase $\Delta T'$.

Similarly, in an analog implementation of the embodiment of FIG. 5, the voltage level of the BIASDEC signal above the threshold voltage of transistor 512 can determine the amount of adjustment of the duty cycle. Thus, increasing the voltage level of the BIASDEC signal will decrease $\Delta T'$. For example, if the threshold level of transistor 512 is 0.5V, any voltage level for BIASINC that is above 0.5V will decrease $\Delta T'$.

Additionally, the strength of the pull down of the second pair of transistors 520 can affect the duty cycle change. The inverter 504 includes an internal pull up resistor (not shown). The ratio of the pull down, effected by the second pair of transistors 520, to the pull up of the internal pull up resistor can adjust the duty cycle. For example, increasing the BIASDEC voltage level above the transistor 512 threshold level can increase the pull down strength and, thus, decrease $\Delta T'$.

Figure 6:
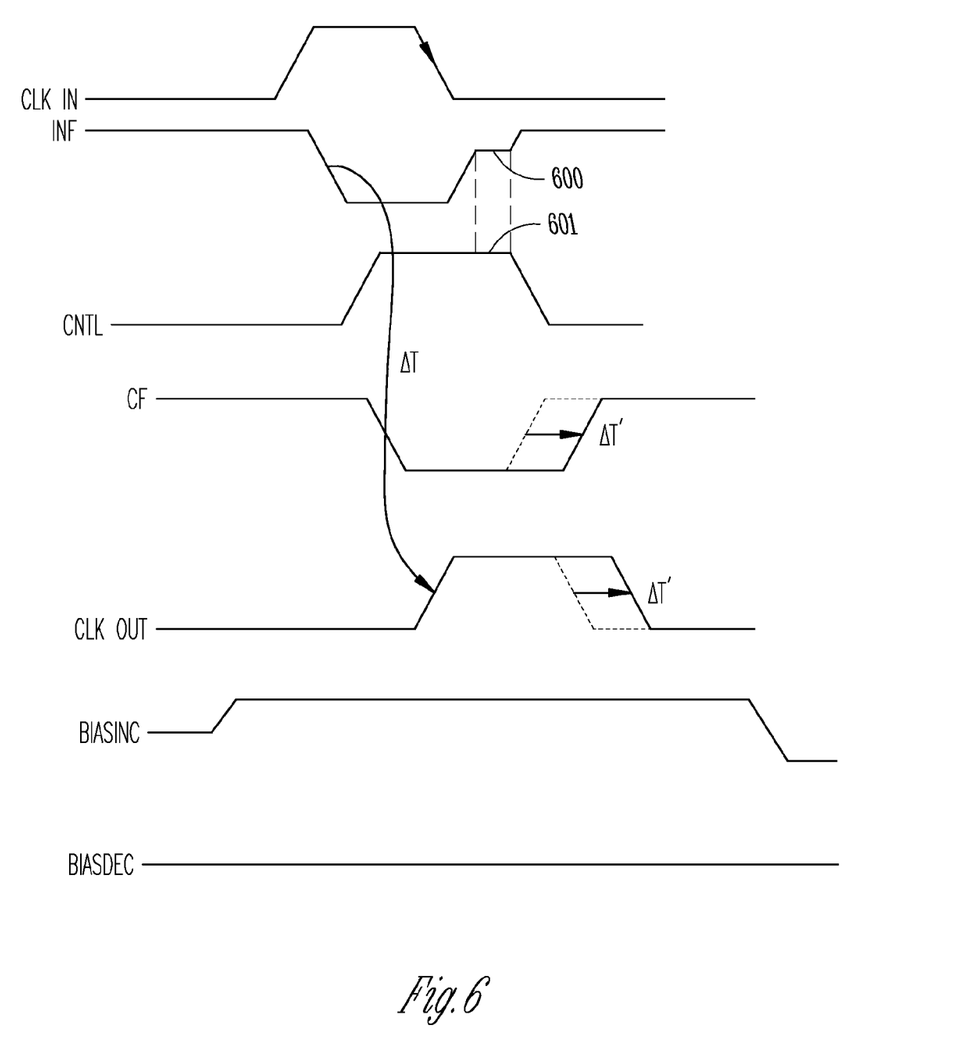
FIG. 6 illustrates an embodiment of a timing diagram for a duty cycle decrease operation in accordance with the embodiment of FIG. 5.

FIG. 6 illustrates an embodiment of a timing diagram for a duty cycle increase operation of the circuit of FIG. 5. The timing diagram shows only a single pulse for purposes of clarity. However, one skilled in the art would realize that the circuit of FIG. 5 would work the same with a signal comprising a plurality of pulses.

Referring to both FIG. 5 and FIG. 6, the CLK IN pulse is shown going from a low level to a high level into the first gate

501. The output of the first gate 501 is the INF node that is shown going to a low level. The low-going INF signal is delayed from the CLK IN signal by one gate delay.

The INF signal is input to the second gate 502 that can then invert it and generate the CNTL signal at the CNTL node. This signal is delayed from the CLK IN signal by two gate delays and is used to control the second transistor 511. When the CNTL signal reaches a threshold voltage for that transistor 511, the transistor 511 can turn on and conduct when both the first transistor 510 is turned on and when the INF signal reaches a collector voltage high enough above the reference. Thus, when the BIASINC signal is high, the INF signal is high, and the CNTL signal is high, the INF node can be pulled down. FIG. 6 shows the time 601 on the CNTL signal where, due to the gate delays, the CNTL signal and the INF signal would be high substantially simultaneously. The time 600 where the INF signal is pulled low is shown matching up with the time 601 of the CNTL signal.

The delay of the INF signal going high at point 600 can cause the CLK OUT signal to be delayed as well. This has the effect of moving the falling edge of CLK OUT by a particular time represented by $\Delta T'$.

During the duty cycle increase operation, the second pair of transistors 520 and the third pair of transistors 530 are turned off since BIASDEC is at a low level such that the first transistor 512 is turned off and BIASINC is at a high level such that the first transistor 515 is turned off (the PMOS transistor 515 is enabled with an active low signal). Thus, the second 520 and third pairs of transistors 520, 530 have no affect on the CLK OUT signal during this operation.

Figure 7:
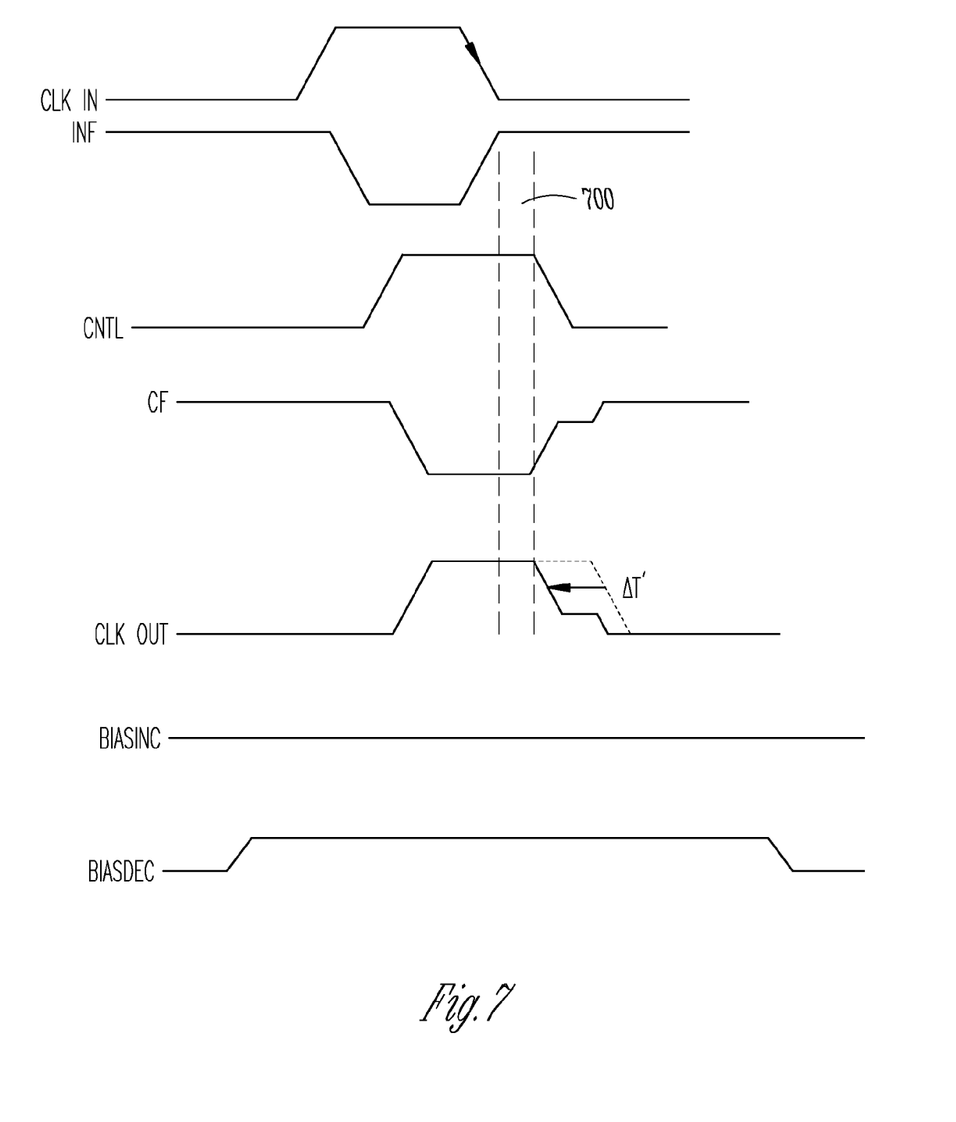
FIG. 7 illustrates an embodiment of a timing diagram for a duty cycle increase operation in accordance with the embodiment of FIG. 5.

FIG. 7 illustrates an embodiment of a timing diagram for a duty cycle decrease operation of the circuit of FIG. 5. The timing diagram shows only a single pulse for purposes of clarity. However, one skilled in the art would realize that the circuit of FIG. 5 would work the same with a signal comprising a plurality of pulses.

Referring to both FIG. 5 and FIG. 7, the CLK IN pulse is shown going from a low level to a high level into the first gate 501. The output of the first gate 501 is the INF node that is shown going to a low level. The low-going INF signal is delayed from the CLK IN signal by one gate delay.

The INF signal is input to the second gate 502 that can then invert it and generate the CNTL signal at the CNTL node. The INF signal can also be used to control the second transistor 513 of the second pair of transistors 520. When the INF signal reaches a threshold voltage for that transistor 513, the transistor 513 can turn on and conduct when both the first transistor 512 of the pair of transistors 520 is turned on and when the CLK OUT signal reaches a collector voltage high enough above the reference. This has the effect of pulling the output down at a time $\Delta T_2$ from when it normally would go low. Additionally, since the BIASINC signal is low during this operation, the third pair transistors 530 can conduct when both the CLK IN signal are low and the CF node goes low. This has the effect of pulling the CF node high at a time $\Delta T_1$ prior to when the CF node would normally go high. Thus, the duty cycle can be adjusted in the range approximately between $\Delta T_1$ and $\Delta T_2$. The range 700 when these signals are true is indicated in FIG. 7.

In the embodiment of FIG. 5, since the quantity of gates that determine $\Delta T_1$ is equal to the quantity of gates that determine $\Delta T_2$, $\Delta T_1 = \Delta T_2$. By increasing the quantity of gates between the INF node and the output, $\Delta T_2$ can be increased. By increasing the quantity of gates between the input and the CF node, $\Delta T_1$ can be increased. In order to keep proper signal level for each node when increasing and decreasing the quantity of gates, the INF node can be located after a first odd number of gates, the CNTL node can be located after first even number of gates, the CF node can be located after a second odd number of gates, and the CLK OUT output can be located after a second even number of gates where the second odd number of gates is greater than first odd number of gates and the second even number of gates is greater than the first even number of gates.

FIG. 8 illustrates an embodiment of any of the first or second transistor pairs 200, 202, 500, 502 of FIG. 2 or 5. As discussed previously, the circuits of those figures used an analog voltage signal to enable/disable the first transistors 205, 207, 510, 512 in the pair of transistors 200, 202, 500, 502. The embodiment of FIG. 8 can use a multiple bit, digital control signal to control the duty cycle adjuster circuits.

The embodiment of FIG. 8 comprises a plurality of transistors 800-803 connected in parallel that together act as the first transistors of the above circuits. The control gates of each transistor 800-803 can be coupled to a different enable signal. Thus, a four bit control word comprising $BIAS_0$, $BIAS_1$, $BIAS_2$, $BIAS_3$ can be used to control the circuit (assuming the second transistor 810 is enabled as described previously). The active state of each enable signal can be determined by the type of transistor (e.g., NMOS, PMOS) used as each of the parallel coupled transistors 800-803.

For example, a 1111 control word provided to the circuit illustrated in FIG. 8 would enable all of the transistors 800-803 if the transistors were NMOS transistors that can be enabled with an active high signal. If the second and fourth transistors 801, 803 were replaced with PMOS transistors, however, a 0000 control word would enable all of the transistors 800-803.

In an analog implementation of the embodiment of FIG. 8, the voltage level of the $BIAS_0$-$BIAS_3$ signals above the threshold voltage of their respective transistors 800-803 can determine the amount of adjustment of the duty cycle. Thus, increasing the voltage level of the $BIAS_0$-$BIAS_3$ signals will increase $\Delta T'$. For example, if the threshold level of transistor 800 is 0.5V, any voltage level for $BIAS_0$ that is above 0.5V will increase $\Delta T'$.

Additionally, the strength of the pull down of any one of the plurality of transistors 800-803 can affect the duty cycle change. The ratio of the pull down, effected by the plurality of transistors 800-803, to the pull up of an internal pull up resistor of any gate coupled to the INF node can adjust the duty cycle. For example, increasing the $BIAS_0$ voltage level above the transistor 800 threshold level can increase the pull down strength and, thus, increase $\Delta T'$.

The above embodiments illustrate the transistors as being NMOS transistors. Other embodiments can use PMOS transistors.

Accordingly, the quantity and types of transistors shown in FIG. 8 are for purposes of illustration only. The quantities and types of transistors can determine the control word content and size.

As used herein, an apparatus may refer to, for example, circuitry, an integrated circuit die, a memory device, a memory array, or a system including such a circuit, die, device or array.

CONCLUSION

One or more embodiments of the duty cycle adjuster circuit can adjust a single type of edges of a signal in order to both increase and decrease a duty cycle. This can result in better jitter performance and output data eye window in a system by eliminating a duty cycle variable on a jitter source due to a rising edge timing being adjusted. The present embodiments can also provide energy efficiency advantages over the prior art by saving power on digital locked loop control logic by providing a more predictable locking time.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. An apparatus comprising:
a plurality of logic gates coupled in series;
a first pull-down circuit coupled to a first node between two adjacent logic gates of the plurality of logic gates and controlled responsive to a first control signal;
a pull-up circuit coupled to a second node between two adjacent logic gates of the plurality of logic gates, wherein the first node is coupled to a logic gate output after a first odd number of the logic gates and the second node is coupled to a gate output after a second odd number of the logic gates where the second odd number is greater than the first odd number; and
a second pull-down circuit coupled to an output of one of the logic gates and controlled responsive to a second control signal, wherein a duty cycle of a signal provided by the plurality of logic gates is increased responsive to the first control signal and decreased responsive to the second control signal.

2. The apparatus of claim 1 wherein the plurality of logic gates comprises a plurality of inverter gates.

3. The apparatus of claim 1 wherein each of the first and second pull-down circuits comprise a plurality of transistors coupled in series.

4. The apparatus of claim 3 wherein the node is a first node and the first pull-down circuit comprises:
a first transistor coupled between the first node and a second transistor, a control gate of the first transistor to receive the first control signal; and
the second transistor coupled between the first transistor and a reference voltage node, the second transistor having a control gate coupled to a second node between two adjacent gates of the plurality of gates.

5. The apparatus of claim 3 wherein a time that the duty cycle of the signal is increased is determined by a voltage to be applied to a transistor of the first pull-down circuit.

6. The apparatus of claim 3 wherein the time that the duty cycle of the signal is decreased is determined by a voltage to be applied to a transistor of the second pull-down circuit.

7. The apparatus of claim 1 wherein the node is a first node and the duty cycle of the signal is adjusted within a time range indicated by a time period between $\Delta T_1$ and $\Delta T_2$, wherein $\Delta T_1$ is determined by a gate delay between an input of the plurality of logic gates and a second node and $\Delta T_2$ is determined by a gate delay between the first node and the output of the one of the logic gates.

8. The apparatus of claim 1 wherein the first and second pull-down circuits each comprise first and second transistors coupled together in series and further comprising:

a control gate of the first transistor of the first pull-down circuit to receive the first control signal;
a control gate of the second transistor of the first pull-down circuit coupled to a third node located after an even number of the gates of the plurality of logic gates;
a control gate of the first transistor of the second pull-down circuit to receive the second control signal; and
a control gate of the second transistor of the second pull-down circuit coupled to the first node.

9. The apparatus of claim 8, wherein the pull-up circuit comprises first and second transistors coupled together in series and further comprising:
a control gate of the first transistor of the pull-up circuit to receive the first control signal; and
a control gate of the second transistor of the pull-up circuit coupled to an input of the plurality of logic gates.

10. The apparatus of claim 1 wherein each of the first and second pull-down circuits comprises:
a plurality of first transistors coupled together in parallel, a control gate of each of the plurality of transistors coupled to a different enable signal of the respective control signal; and
a second transistor coupled between the plurality of first transistors and a reference node.

11. The apparatus of claim 10 wherein the plurality of first transistors coupled together in parallel comprise a plurality of control gates coupled to a plurality of enable signals, each control gate coupled to a different enable signal.

12. The apparatus of claim 11 wherein each of the first and second pull-down circuits is selectively enabled in response to a control word configured to act as the plurality of enable signals.

13. The apparatus of claim 12 wherein the duty cycle is determined in response to voltage levels of each of the plurality of enable signals.

14. The apparatus of claim 13 wherein the duty cycle is adjusted based on the voltage levels in relation to a threshold voltage of each respective transistor of the plurality of first transistors.

15. The apparatus of claim 14 wherein the duty cycle is adjusted based on a ratio of a pull down strength of the plurality of first transistors to a pull up strength of the plurality of logic gates.

16. The apparatus of claim 1, wherein the plurality of logic gates and the first and second pull-down circuits comprise a duty cycle adjuster circuit that can adjust the duty cycle of the signal by adjusting only a single type of edges of the signal.

17. The apparatus of claim 1, wherein the plurality of logic gates and the first and second pull-down circuits comprise a duty cycle adjuster circuit that can increase the duty cycle of the signal by adjusting falling edges of the signal responsive to the first control signal.

18. The apparatus of claim 17, wherein the duty cycle adjuster can also decrease the duty cycle of the signal by adjusting the falling edges of the signal responsive to the second control signal.

* * * * *